(12) United States Patent  (10) Patent No.: US 9,275,925 B2
Chen et al.  (45) Date of Patent: Mar. 1, 2016

(54) SYSTEM AND METHOD FOR AN IMPROVED INTERCONNECT STRUCTURE (71) Applicant: Taiwan Semiconductor Manufacturing Company, Ltd., Hsin-Chu (TW)

(72) Inventors: Hsien-Wei Chen, Hsin-Chu (TW); Hao-Yi Tsai, Hsin-Chu (TW); Mirng-Ji Lii, Sinpu Township (TW); Chen-Hua Yu, Hsin-Chu (TW); Tsung-Yuan Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 211 days.

(21) Appl. No.: 13/799,157

(22) Filed: Mar. 13, 2013

(65) Prior Publication Data

US 2014/0262468 A1  Sep. 18, 2014

Related U.S. Application Data (60) Provisional application No. 61/778,228, filed on Mar. 12, 2013.

(51) Int. Cl.
*H05K 1/11* (2006.01)
*H01L 23/31* (2006.01)
(Continued)

(52) U.S. Cl.
CPC .......... *H01L 23/3192* (2013.01); *H01L 21/566* (2013.01); *H01L 23/53295* (2013.01); *H01L 24/05* (2013.01); *H01L 23/525* (2013.01); *H01L 23/53214* (2013.01); *H01L 23/53228* (2013.01); *H01L 23/53242* (2013.01);
(Continued)

(58) Field of Classification Search
CPC ............ H05K 1/02; H05K 1/11; H01L 21/60; H01L 21/78; H01L 23/485; H01L 23/498
USPC .......... 174/262, 250, 261, 264; 257/737, 762, 257/774, 778; 428/209, 421, 901
See application file for complete search history.

(56) References Cited

U.S. PATENT DOCUMENTS 4,739,448 A * 4/1988 Rowe et al. .............. 361/719
5,830,563 A * 11/1998 Shimoto et al. ........... 428/209
(Continued)

FOREIGN PATENT DOCUMENTS

JP  2006120978  5/2006
KR  20010056082  7/2001
(Continued)

*Primary Examiner* — Xiaoliang Chen
(74) *Attorney, Agent, or Firm* — Slater & Matsil, L.L.P.

(57) ABSTRACT

Presented herein are an interconnect structure and method for forming the same. The interconnect structure comprises a contact pad disposed over a substrate and a connector disposed over the substrate and spaced apart from the contact pad. A passivation layer is disposed over the contact pad and over connector, the passivation layer having a contact pad opening, a connector opening and a mounting pad opening. A post passivation layer comprising a trace and a mounting pad is disposed over the passivation layer. The trace may be disposed in the contact pad opening and contacting the mounting pad, and further disposed in the connector opening and contacting the connector. The mounting pad may be disposed in the mounting pad opening and contacting the opening. The mounting pad separated from the trace by a trace gap, which may optionally be at least 10 μm.

20 Claims, 5 Drawing Sheets (51) Int. Cl.
*H01L 21/56* (2006.01)
*H01L 23/525* (2006.01)
*H01L 23/00* (2006.01)
*H01L 23/532* (2006.01)

(52) U.S. Cl.
CPC .......... *H01L 23/53257* (2013.01); *H01L 24/03* (2013.01); *H01L 24/11* (2013.01); *H01L 24/13* (2013.01); *H01L 2224/0401* (2013.01); *H01L 2224/05124* (2013.01); *H01L 2224/05139* (2013.01); *H01L 2224/05144* (2013.01); *H01L 2224/05147* (2013.01); *H01L 2224/05548* (2013.01); *H01L 2224/05572* (2013.01); *H01L 2224/05573* (2013.01); *H01L 2224/05611* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/1181* (2013.01); *H01L 2224/1191* (2013.01); *H01L 2224/11849* (2013.01); *H01L 2224/13111* (2013.01); *H01L 2224/13116* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16225* (2013.01); *H01L 2224/16227* (2013.01); *H01L 2224/81815* (2013.01); *H01L 2924/181* (2013.01); *H01L 2924/3512* (2013.01)

(56) References Cited

U.S. PATENT DOCUMENTS

| | | | | |
|---|---|---|---|---|
| 5,923,539 | A * | 7/1999 | Matsui et al. | 361/777 |
| 5,969,422 | A * | 10/1999 | Ting et al. | 257/762 |
| 6,181,278 | B1 * | 1/2001 | Kakimoto et al. | 343/700 MS |
| 6,365,843 | B1 * | 4/2002 | Shirai et al. | 174/262 |
| 6,407,343 | B1 * | 6/2002 | Tanaka | 174/261 |
| 6,793,505 | B2 * | 9/2004 | Dishongh et al. | 439/71 |
| 2002/0000895 | A1 * | 1/2002 | Takahashi et al. | 333/133 |
| 2003/0043556 | A1 * | 3/2003 | Sugimoto et al. | 361/760 |
| 2003/0102151 | A1 * | 6/2003 | Hirose et al. | 174/250 |
| 2004/0089470 | A1 * | 5/2004 | Shimoto et al. | 174/250 |
| 2004/0180540 | A1 * | 9/2004 | Yamasaki et al. | 438/667 |
| 2006/0087040 | A1 | 4/2006 | Shibasaki | |
| 2007/0228110 | A1 * | 10/2007 | Eldridge et al. | 228/180.5 |
| 2008/0149379 | A1 * | 6/2008 | Nagase et al. | 174/260 |
| 2008/0151517 | A1 * | 6/2008 | Sakamoto et al. | 361/761 |
| 2008/0151522 | A1 * | 6/2008 | Sakamoto et al. | 361/783 |
| 2008/0202803 | A1 * | 8/2008 | Nagase et al. | 174/262 |
| 2009/0065246 | A1 * | 3/2009 | Shih | 174/264 |
| 2009/0184411 | A1 | 7/2009 | Chung et al. | |
| 2010/0071940 | A1 * | 3/2010 | Ejiri et al. | 174/257 |
| 2010/0283148 | A1 * | 11/2010 | Tsai et al. | 257/737 |
| 2011/0018099 | A1 * | 1/2011 | Muramatsu | 257/532 |
| 2011/0147951 | A1 * | 6/2011 | Murayama et al. | 257/778 |
| 2011/0155442 | A1 * | 6/2011 | Yamada | 174/266 |
| 2012/0018874 | A1 | 1/2012 | Lin et al. | |
| 2012/0038044 | A1 | 2/2012 | Chang et al. | |
| 2012/0080788 | A1 * | 4/2012 | Arai | 257/737 |
| 2013/0320522 | A1 * | 12/2013 | Lai et al. | 257/737 |
| 2014/0048949 | A1 * | 2/2014 | Lin et al. | 257/774 |
| 2014/0159250 | A1 * | 6/2014 | Nickerson | 257/774 |

FOREIGN PATENT DOCUMENTS

| | | |
|---|---|---|
| KR | 20080078742 A | 8/2008 |
| KR | 20090080752 | 7/2009 |
| TW | 201208021 | 2/2012 |
| TW | 201209978 | 3/2012 |
| WO | 0249103 A2 | 6/2002 |

\* cited by examiner

SYSTEM AND METHOD FOR AN IMPROVED INTERCONNECT STRUCTURE

CROSS-REFERENCE TO RELATED APPLICATIONS

This application claims the benefit of U.S. Provisional Application No. 61/778,228, filed on Mar. 12, 2013, entitled "System and Method for Improved Interconnect Structure" which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Solder ball grid arrays are also a technique sometimes used to join substrate, dies or packages, with an array of solder balls deposited on the bonding pads of a first substrate, and with a second substrate, die or package joined at its own bonding pad sites to the first pad via the solder balls. Solder balls may be formed on a pad as liquid solder, and then solidified for additional processing. The environment with the solder balls is subsequently heated to melt the solder balls and the packages compressed to cause the solder balls to contact the upper and lower pads.

In some systems, a trace may be disposed over an upper protective layer, above the passivation layer. Such traces may be referred to as post-passivation interconnects (PPIs). Such PPIs may be used to connect a trace on, for example, a substrate or in a redistribution layer (RDL), to a pad or land below the passivation layer. The mounting pads may have a solder ball as part of a ball grid array, or may have another package connector, permitting a second package to be mounted and still be in electrical communication with the lands below the passivation layer.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive interconnect or joint (an "interconnect"), and do not limit the scope of the disclosure.

Embodiments will be described with respect to a specific context, namely making and using interconnects useful in, for example, fan-in or fan-out wafer level packaging or WLCSP assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

The embodiments of the present disclosure are described with reference to FIGS. 1 through 12, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Figure 1:
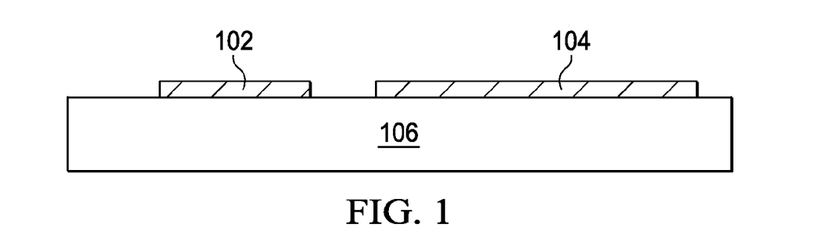
FIGS. 1 through 9 illustrate cross-sectional views of intermediate steps in forming an interconnect according to an embodiment.

FIG. 1 is a cross-sectional view illustrating formation of a contact pad 102 and connector 104 of an interconnect according to an embodiment. A contact pad 102 and a connector 104 may be formed on a die substrate 106. The contact pad 102 and connector 104 may be spaced apart. In an embodiment, the contact pad 102 and connector 104 may be formed in a single process step, for example, through a masking and deposition process, through a damascene process, or another suitable process. The contact pad 102 and connector 104 may be disposed in the same level, such as on the die substrate 106, in a same metallization layer, or the like. In an embodiment, the connector 104 may be disposed in a level different from the contact pad 102, for example in a higher metallization layer, over a passivation layer above the contact pad 102, or the like.

Additionally, the contact pad 102 and connector 104 may be a conductive material, such as copper (Cu), tungsten (W), gold (Au), silver (Ag), aluminum, (Al), lead (Pb), tin (Sn), alloys of the same, or the like. The die substrate 106 may be a semiconductor, such as silicon (Si), gallium arsenide (GaAs), silicon-on-insulator (SoI) or the like. In an embodiment, the die substrate 106 may be a redistribution layer (RDL), intermetal dielectric (IMD), interlayer dielectric (ILD) or the like.

The contact pad 102 and connector 104 may be formed using photolithography and deposition processes such as plasma enhanced chemical vapor deposition (PECVD), physical vapor deposition (PVD), sputtering, or another deposition process. For example, the contact pad 102 and connector 104 regions may be defined by a mask, and a conductive material deposited in openings in the mask then planarized to form the contact pad 102 and connector 104. A chemical mechanical polish, for example, may be used to planarize the contact pad 102 and connector 104. While the contact pad 102 and connector 104 are illustrated as being disposed over the die substrate 106, the contact pad 102 and connector 104 may be disposed in the die substrate 106, with the upper surface of each exposed. For example, in one embodiment, the contact pad 102 and connector 104 may be formed using a damascene process. In such an embodiment, the die substrate 106 may be etched other otherwise processed to form recesses, and a conductive material may be deposited in the recesses, with excess material removed via planarization, leaving the contact pad 102 and the connector 104 in the die substrate 106 recesses.

Figure 2:
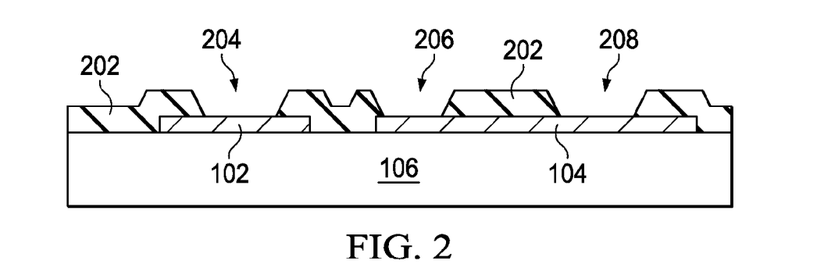

FIG. 2 is a cross-sectional view illustrating formation of a passivation layer 202 according to an embodiment. An insulating layer may comprise a passivation layer 202 which may be deposited over the die substrate 106 and over a portion of the contact pad 102 and connector 104. In an embodiment, the passivation layer 202 may be masked or otherwise formed to have a contact pad opening 204 exposing a portion of the contact pad 102. A connector opening 206 and a mounting pad opening 208 may be formed in the passivation layer 202 to each expose a portion of the connector 104.

Figure 3:
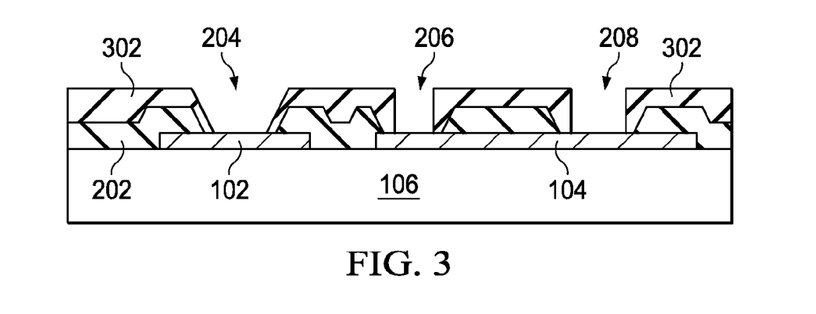

FIG. 3 is a cross-sectional view illustrating formation of a protective layer 302 according to an embodiment. The insulating layer may further comprise a protective layer 302 which may be formed over the passivation layer 202, and which may be a polymer, polyimide, nitride, oxide or other non-conductive layer. The protective layer 302 may be formed via a masking and deposition process, via a deposition and etching process, or the like. In an embodiment, the protective layer 302 may be formed to cover the passivation layer, and contacting the contact pad 102 through the contact pad opening 204 and also contacting the connector 104 through the connector opening 206 and mounting pad opening 208.

Figure 4:
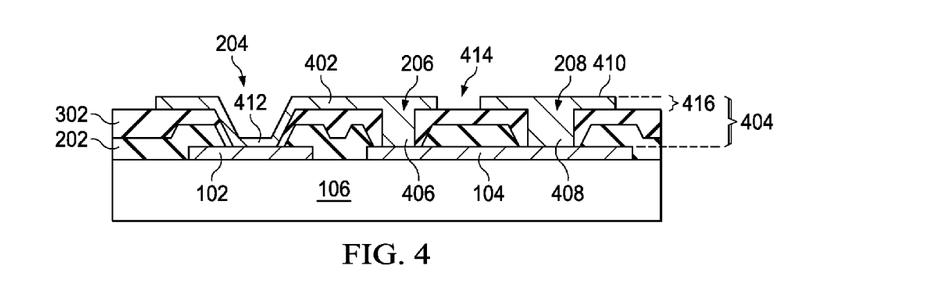

FIG. 4 is a cross-sectional view illustrating formation of a post-passivation layer according to an embodiment. A post passivation layer may comprise a trace 402 and a mounting pad 404. The trace 402 and mounting pad 404 may be disposed in a layer or level higher than the contact pad 102 and connector 104, for example, over the protective layer 302, in a higher metallization layer, or the like. The trace 402 may be formed in the contact pad opening 204 with a trace contact pad portion 412 in contact with the contact pad 102. The trace 402 and mounting pad 404 may be conductive material such as a metal such as copper (Cu), tungsten (W), gold (Au), silver (Ag), aluminum, (Al), lead (Pb), tin (Sn), alloys of the same, or the like. The trace 402 may also have a trace connector via 406 disposed in the connector opening 206 and contacting the connector 104. Thus, in an embodiment, the trace 402 may electrically connect the contact pad to the connector 104. The mounting pad 404 may be formed with a mounting pad via 408 disposed in the mounting pad opening 208 and in contact with the connector 104. In an embodiment, the mounting pad 404 may have an upper mounting pad portion 416 disposed over, or above, the upper surface of the protective layer 302.

The trace 402 and mounting pad 404 are illustrated as being in direct contact with the contact pad 102 and connector 104, however, the contact pad 102 and connector 104 may have one or more outer layers, such as seed layers, barrier layers, anticorrosion layers or like, and the trace 402 or mounting pad 404 may contact the contact pad 102 or connector 104 by way of these outer layers. The trace 402 and mounting pad 404 may also comprise one or more outer layers, and may contact the contact pad 102 or connector through these outer layers.

The upper mounting pad portion 416 may be separated from, or spaced apart from, the trace 402 by a trace gap 414. The trace 402 may be electrically connected to the mounting pad 404 by way of the connector 104, but may avoid direct contact with the mounting pad 404 by a separation due to the trace gap 414.

In an embodiment, the trace 402 and the mounting pad 404 may be PPI structures. The trace 402 and mounting pad 404 may be formed through deposition, plating or another technique. In an embodiment, the trace 402 and mounting pad may be formed by masking and metal deposition, or may be masked and etched after deposition.

Figure 5:
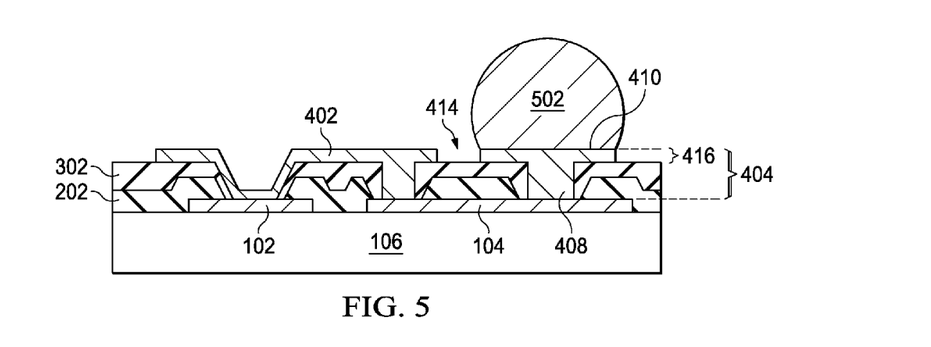

FIG. 5 is a cross-sectional view of the application of a mounting structure 502 to the mounting pad 404 according to an embodiment. The mounting structure 502 may be formed on a mounting pad upper surface 410. In an embodiment, the mounting structure 502 may be solder, a metal such as copper (Cu), gold (Au), aluminum, (Al), lead (Pb), tin (Sn), nickel (Ni), palladium (Pd) or the like. The mounting structure may also be a combination of materials such as nickel and palladium or nickel, palladium and gold that are formed for example, through a process such as electroless nickel electroless palladium (ENEP) or electroless nickel electroless palladium immersion gold (ENEPIG). In an embodiment, the trace gap 414 may be sized to avoid permitting material on the mounting pad 404 from wetting the trace 402 and forming a weak joint. Separation of the mounting pad 404 from the trace 402 by a trace gap 414 prevents the mounting structure 502 from wetting the trace 402 and forming a "bird beak" at the trace-to-mounting pad connection point. Such irregular "bird beak" structure tends to create stress points where the mounting structure 502 contacts the trace 402, leading to stress cracking of the mounting structure 502 or separation of the mounting structure from the mounting pad 404. Eliminating the irregularities in mounting structure 502 leads to a more robust joint.

In one embodiment, the mounting structure 502 may be applied to the mounting pad 404 so that the mounting structure contacts the mounting pad upper surface 410, and avoids the sides of the upper mounting pad portion 416. In such an embodiment, the mounting structure 502 may contact and cover all of, or a portion of, the mounting pad upper surface 410. In another embodiment, the mounting structure 502 may contact, or wet, at least a portion of the sides of the upper mounting pad portion 416 and at least a portion of the mounting pad upper surface 410. In yet another embodiment, the mounting structure 502 may contact the entire mounting pad upper surface 410 and contact a portion of the upper mounting pad portion 416 around the entire perimeter of the upper mounting pad portion 416, extending over the edge of the upper mounting pad portion 416 partially down the sidewall.

Figure 6:
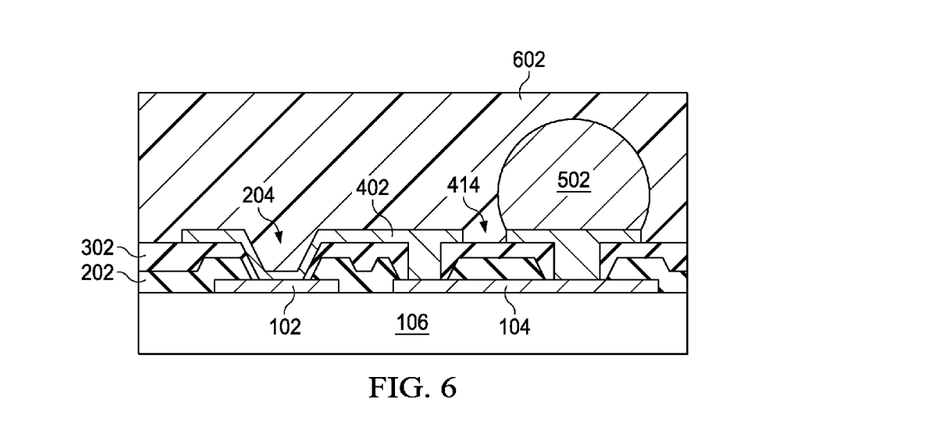

FIG. 6 is a cross-sectional view of the application of molding compound 602 according to an embodiment. In one embodiment, the molding compound 602 may be a nonconductive material, such as an epoxy, a resin, a moldable polymer, or the like. The molding compound 602 may be formed to provide lateral support to the mounting structure 502 during subsequent processing such as reflow.

Figure 7:
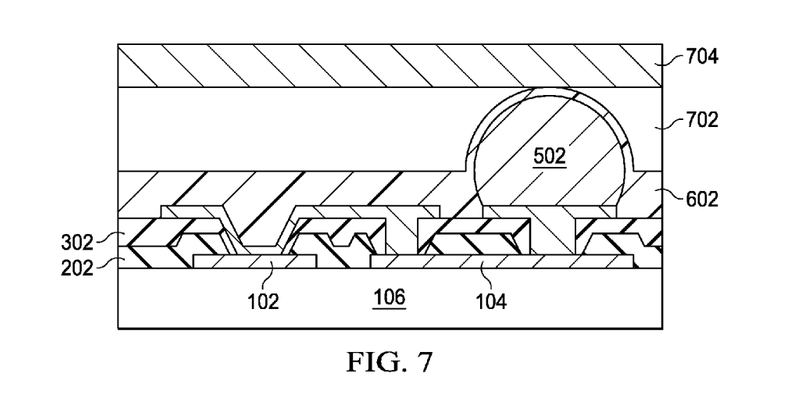

FIG. 7 is a cross-sectional view illustrating molding of the molding compound 602 according to an embodiment. The molding compound 602 may be shaped or molded using for example, a mold 704. A release compound 702 may be optionally applied to the mold 704 to prevent the molding compound 602 from adhering to the mold 704. The mold 704 may have a border or other feature for retaining molding compound 602 when the mold 704 is applied to the molding compound 602.

The molding compound 602 may be formed by the mold 704 using a layer of release compound 702 thick enough to compress the molding compound 602 while still separating the mold 704 from the mounting structure 502. The mold 704 may also be configured to accept one or more mounting structure 502 by way of recesses (not shown) formed in the mold 704. In an embodiment, the mold 704 may be used to pressure mold the molding compound 602 to force the molding compound 602 into openings and recesses, and may avoid air pockets or the like in the molding compound 602. In an embodiment, the molding compound 602 may be injection molded, with the mold 704 placed over the mounting structure 502 and a molding compound introduced after the mold 704 is placed.

Figure 8:
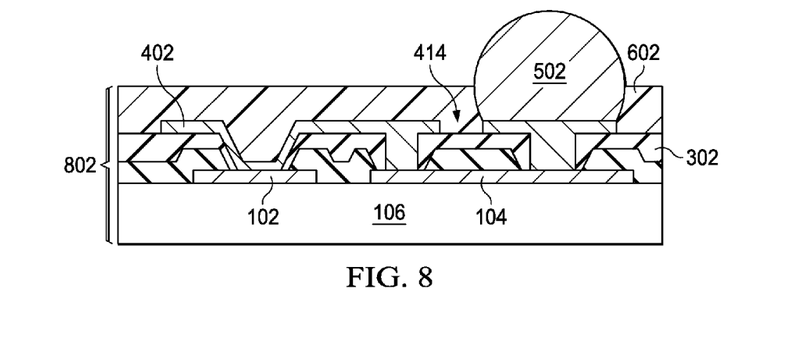

FIG. 8 is a cross-sectional view illustrating a mounting structure 502 with cured molding compound 602. The molding compound 602 may be cured, and the mold 704 (FIG. 7) and release compound 702 (FIG. 7) removed. The molding compound 602 may be applied while substantially liquid, and then may be cured through a chemical reaction, such as in an epoxy or resin. In another embodiment the molding compound 602 may be an ultraviolet (UV) cured polymer applied as a gel or malleable solid capable of being disposed on the trace 402, on the protective layer 302 and around or conforming to the mounting structure 502 surface. The optional application of the release compound 702 may permit parting of the mold 704 from the molding compound 602, and may be used in an embodiment where the molding compound 602 is an epoxy or resin to prevent the molding compound 602 from adhering to the mold 704 surface.

In an embodiment, the molding compound 602 may be molded over a lower portion of the mounting structure 502. An upper portion of the mounting structure 502 may extend above an uppermost surface of the molding compound 602 and be exposed through the molding compound 602. The molding compound 602 retains this shape during activation or reflow. For example, where the mounting structure 502 is solder or another metal, the mounting structure 502 may be reflowed for attaching a second substrate. In such an example, the molding compound 602 may confine solder mounting structures 502 and prevent bridging between adjacent mounting structures during the reflow process.

A plasma cleaning process may optionally be performed. In an embodiment, the plasma clean process may clean the mounting structure 502 and remove any residual release compound 702 or molding compound 602.

Figure 9:
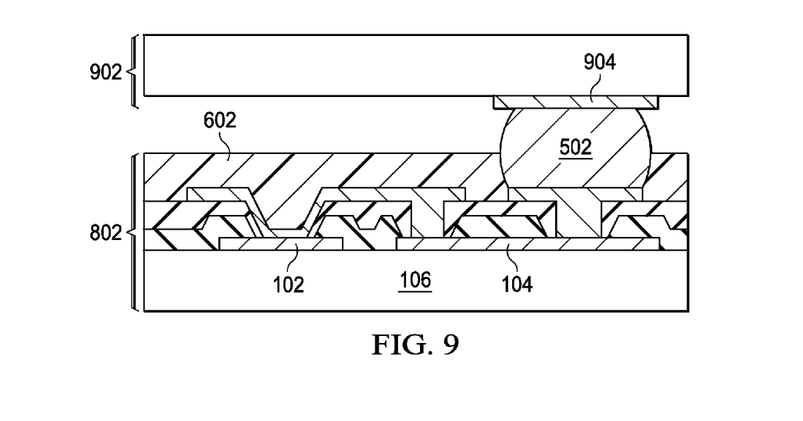

FIG. 9 is a cross-sectional view illustrating a mounting a second substrate 902 on the mounting structure 502. The mounting structure 502 material may be activated to attach the second substrate 902, thereby forming an electrical connection between the contact pad 102 on the first substrate 802 and the second substrate 902. For example, in an embodiment, the mounting structure 502 may be solder or another metal. The mounting structure 502 may be reflowed, or heated to a melting point, and the second substrate 902 may be mounted on the mounting structure 502, and the mounting structure 502 subsequently solidified In an embodiment, the second substrate 902 may have lands 904, which may be joined to the mounting structure 502. The second substrate 902 may be a die, wafer, interposer, or another electrical component. Thus, the second substrate 902 or devices disposed thereon may be electrically connected to the contact pad 102.

Figure 10:
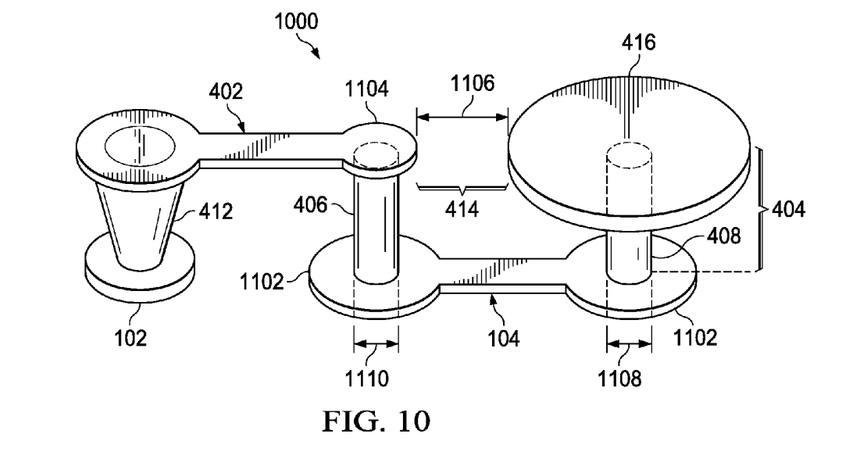
FIG. 10 illustrates a perspective view of an interconnect structure according to an embodiment.
Figure 11:
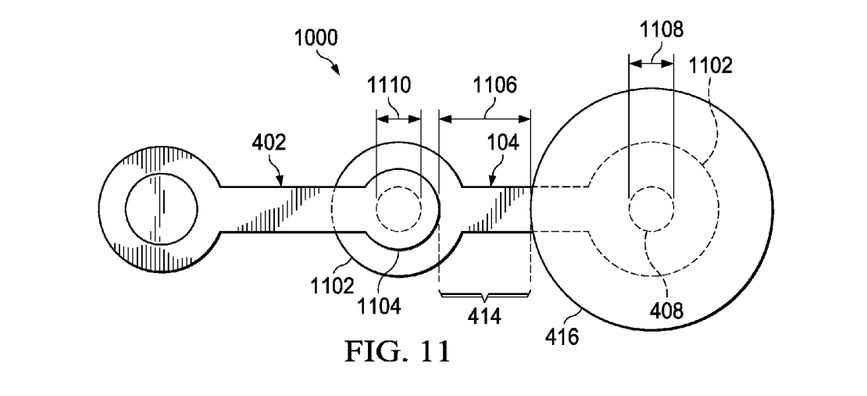
FIG. 11 illustrates a top view of an interconnect structure according to an embodiment.

FIGS. 10 and 11 illustrate a perspective view and a top view, respectively, of an interconnect structure 1000 according to an embodiment. The interconnect structure 1000 illustrated in FIGS. 10 and 11 is shown, for clarity, without the substrate 106, passivation layer 202, protective layer 302 or mounting structure 502 shown in FIGS. 1-9.

The mounting pad 404 has an upper mounting pad portion 416 that is disconnected or spaced apart from the trace 402 by a trace gap 414 in the region where a mounting structure 502 (FIGS. 5-9) is applied to the upper mounting pad portion 416.

The upper mounting pad portion 416 is connected to the trace 402 by way of the connector 104 disposed in a different level than the upper mounting pad portion 416. The trace connector via 406 and mounting pad via 408 connect the trace 402 and upper mounting pad portion 416 to the connector 104, respectively. The connector 104 may comprise connector contact pad portions 1102 that accept the trace connector via 406 and mounting pad via 408. The connector contact pad portions 1102 may be formed having a size greater than the trace connector via diameter 1110 and mounting pad via diameter 1108. Additionally the trace 402 may comprise a trace contact portion 1104, which may be formed having a size greater than the trace connector via diameter 1110.

The upper mounting pad portion 416 may be sized, for example, according to the material characteristics or a predetermined size of the mounting structure 502. In an embodiment, the upper mounting pad portion 416 may have a size or diameter greater than the mounting pad via 408. In an embodiment, the trace gap spacing 1106 may be about 10 µm or greater, which may be sufficient to prevent bridging of a mounting structure 502 (FIGS. 5-9) to the trace. The trace gap spacing 1106 may be adjusted to account for different geometries or disposition of the trace 102 in relation to the upper mounting pad region 416, to account for varying mounting structure 502 (FIGS. 5-9) shape and materials, to account for varying processing methods, or to account for another factor. Additionally, the trace connector via diameter 1110 and mounting pad via diameter 1108 may each be about 20 µm or greater. The via diameters 1110 and 1108 may each be independently varied to accommodate varying lengths or materials of the vias 406 and 408.

Figure 12:
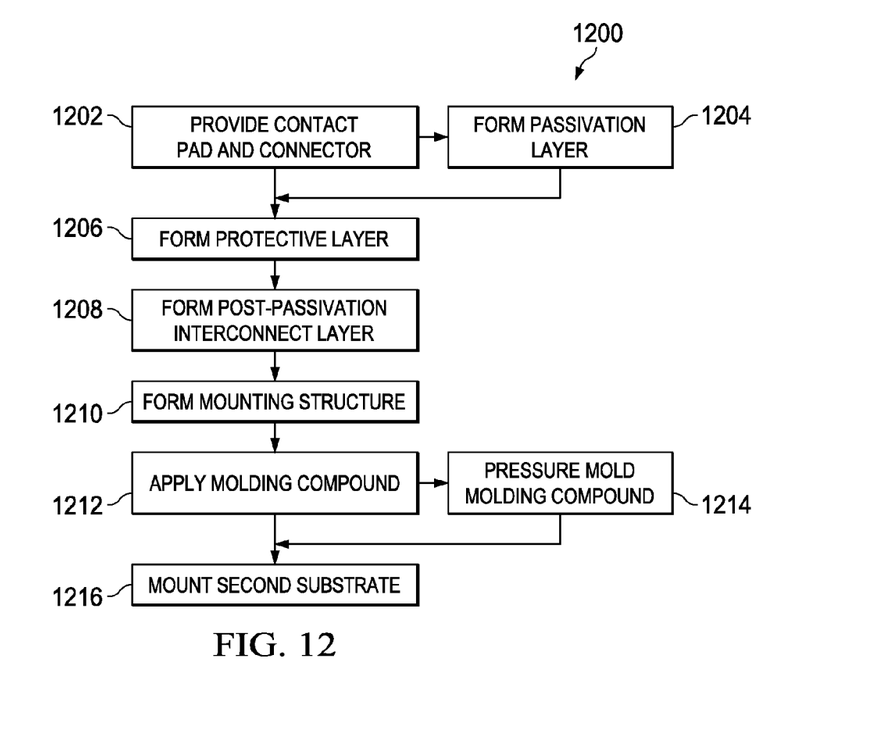
FIG. 12 is a flow diagram illustrating a method for forming an interconnect structure according to an embodiment.

FIG. 12 is a flow diagram illustrating a method 1200 for forming an interconnect structure according to an embodiment. In block 1202, a contact pad and connector may be provided by forming the contact pad and connector on a die substrate, for example, or in a metallization layer. In block 1204, a passivation layer may optionally be formed over at least a portion of the contact pad and a portion of the connector. Openings exposing the contact pad and connector may be formed during passivation layer formation, or may be created after the passivation layer is formed. In block 1206, a protective layer may be formed over the contact pad and connector, with openings exposing the contact pad and connector. In block 1208, a post passivation interconnect layer may be formed over the protective layer. A trace and a mounting pad may be formed as part of the post-passivation interconnect layer, with the trace connecting the mounting pad to the connector and the mounting pad connected to the connector but spaced apart from the trace.

In block 1210, a mounting structure may be formed. In block 1212, a molding compound may be applied and in block 1214, the molding compound may optionally be pressure molded. The molding compound may be applied in block 1212 as a liquid, and a mold with an optional release compound may be used to form or pressure mold the molding compound around the mounting structure. The molding compound may also be formed over and covering the post-passivation layer, including the trace. In block 1216, a second substrate may be mounted to the mounting structure and affixed.

An interconnect structure according to an embodiment may comprise a mounting pad disposed over a substrate and at a first level, a connector disposed at a second level over the substrate and electrically connected to the mounting pad, and a trace disposed over the substrate and at a level above the second level. The trace may be electrically connected to the connector and electrically connected to the mounting pad by way of the connector. The trace may be spaced apart from the mounting pad.

An embodiment of a structure may comprise a contact pad disposed over a substrate, a connector disposed over the substrate and spaced apart from the contact pad, and an insulating layer comprising a passivation layer disposed over the contact pad and over connector. The passivation layer may have a contact pad opening, a connector opening and a mounting pad opening. A post-passivation layer may be disposed over the passivation layer, and may comprise a trace and a mounting pad. The trace may be disposed in the contact pad opening and may contact the mounting pad. The trace may be further disposed in the connector opening and may contact the connector. The mounting pad may be disposed in the mounting pad opening and may contact the connector, and the mounting pad may be separated from the trace by a trace gap.

A method of forming an interconnect structure according to an embodiment may comprise providing a contact pad and a connector over a substrate, forming a passivation layer over at least a portion of the contact pad and over at least a portion of the connector and forming a post-passivation layer over the passivation layer. Forming the post passivation layer may comprise forming a trace on the contact pad and on the connector and forming a mounting pad on the connector and spaced apart from the trace.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An interconnect structure, comprising:
a connector disposed over a substrate and at a second level below a first level, the substrate having a major surface;
an insulating layer disposed over the substrate and over the connector;
a mounting pad disposed over the insulating layer and at the first level, the mounting pad electrically connected to the connector;
a trace disposed over the insulating layer and at the first level and having a major axis extending in a direction parallel to the major surface of the substrate, the trace electrically connected to the connector and electrically connected to the mounting pad by way of the connector, the trace spaced apart from the mounting pad in a direction parallel to the major surface of the substrate;
a contact pad disposed over the substrate and at the second level, the contact pad electrically connected to and in physical contact with the trace; and
a mounting structure disposed on the mounting pad.

2. The interconnect structure of claim 1, the mounting pad comprising a mounting pad via and an upper mounting pad portion, the mounting pad via extending from the upper mounting pad portion to the connector.

3. The interconnect structure of claim 2, wherein the mounting pad is spaced apart from the trace by a distance of 10 µm or greater.

4. The interconnect structure of claim 3, wherein the mounting pad via has a diameter of 20 µm or greater.

5. The interconnect structure of claim 2, wherein the insulating layer comprises a passivation layer disposed over a portion of the contact pad and further disposed over a portion of the connector.

6. The interconnect structure of claim 5, wherein the insulating layer further comprises a protective layer disposed over the passivation layer, the trace disposed over at least a portion of the protective layer, and the mounting pad disposed over at least a portion of the protective layer.

7. The interconnect structure of claim 6, further comprising a molding compound disposed over the trace and around the mounting structure.

8. The interconnect structure of claim 1, wherein the insulating layer comprises a multi-layer insulator.

9. The interconnect structure of claim 1, wherein the trace is in physical contact with the connector.

10. The interconnect structure of claim 1, wherein the mounting pad is in physical contact with the connector.

11. The interconnect structure of claim 1, wherein the insulating layer comprises a passivation layer disposed over the connector, the passivation layer having a connector opening and having a mounting pad opening.

12. The interconnect structure of claim 11 further comprising a post-passivation layer disposed over the passivation layer.

13. An interconnect structure, comprising:
a connector disposed over a substrate and at a second level below a first level, the substrate having a major surface;
an insulating layer disposed over the substrate and over the connector;
a mounting pad disposed over the insulating layer and at the first level, the mounting pad electrically connected to the connector;
a trace disposed over the insulating layer and at the first level and having a major axis extending in a direction parallel to the major surface of the substrate, the trace electrically connected to the connector and electrically connected to the mounting pad by way of the connector, the trace spaced apart from the mounting pad in a direction parallel to the major surface of the substrate;
a contact pad disposed over the substrate and at the second level, the contact pad electrically connected to and in physical contact with the trace; and
a mounting structure disposed on the mounting pad; and
wherein the trace is in physical contact with the connector.

14. The interconnect structure of claim 13, wherein the mounting pad comprises a mounting pad via and an upper mounting pad portion, the mounting pad via extending from the upper mounting pad portion to the connector.

15. The interconnect structure of claim 14, wherein the insulating layer comprises a passivation layer disposed over a portion of the connector.

16. The interconnect structure of claim 15, wherein the insulating layer further comprises a protective layer disposed over the passivation layer, the trace disposed over at least a portion of the protective layer, and the mounting pad disposed over at least a portion of the protective layer.

17. The interconnect structure of claim 16, further comprising
a molding compound disposed over the trace and around the mounting structure.

18. An interconnect structure, comprising:
a connector disposed over a substrate and at a second level below a first level, the substrate having a major surface;
an insulating layer disposed over the substrate and over the connector;
a mounting pad disposed over the insulating layer and at the first level, the mounting pad electrically connected to the connector;
a trace disposed over the insulating layer and at the first level and having a major axis extending in a direction parallel to the major surface of the substrate, the trace electrically connected to the connector and electrically connected to the mounting pad by way of the connector, the trace spaced apart from the mounting pad in a direction parallel to the major surface of the substrate;
a contact pad disposed over the substrate and at the second level, the contact pad electrically connected to and in physical contact with the trace; and
a mounting structure disposed on the mounting pad; and
wherein the mounting pad is in physical contact with the connector.

19. The interconnect structure of claim 18, wherein the mounting pad comprises a mounting pad via and an upper mounting pad portion, the mounting pad via extending from the upper mounting pad portion to the connector.

20. The interconnect structure of claim 18, wherein the insulating layer comprises a multi-layer insulator.

* * * * *